United States Patent
Kurapov et al.

(10) Patent No.: US 10,053,769 B2
(45) Date of Patent: Aug. 21, 2018

(54) TARGET PREPARATION

(71) Applicant: Oerlikon Surface Solutions AG, Trübbach, Trübbach (CH)

(72) Inventors: Denis Kurapov, Walenstadt (CH); Siegfried Krassnitzer, Feldkirch (AT)

(73) Assignee: Oerlikon Surface Solutions AG, Pfäffikon, Pfäffikon (CH)

(*) Notice: Subject to any disclaimer, the term of this patent is extended or adjusted under 35 U.S.C. 154(b) by 0 days.

(21) Appl. No.: 14/902,581

(22) PCT Filed: Jun. 30, 2014

(86) PCT No.: PCT/EF2014/001783
§ 371 (c)(1),
(2) Date: Jan. 3, 2016

(87) PCT Pub. No.: WO2015/000578
PCT Pub. Date: Jan. 8, 2015

(65) Prior Publication Data
US 2016/0186310 A1    Jun. 30, 2016

(30) Foreign Application Priority Data
Jul. 3, 2013    (DE) .......... 10 2013 011 072

(51) Int. Cl.
C23C 14/35    (2006.01)
C23C 14/34    (2006.01)
(Continued)

(52) U.S. Cl.
CPC .......... C23C 14/3407 (2013.01); C23C 14/02 (2013.01); C23C 14/021 (2013.01);
(Continued)

(58) Field of Classification Search
CPC ..... C23C 14/02; C23C 14/021; C23C 14/022; C23C 14/024; C23C 14/325; C23C 14/3407; C23C 14/35; H01J 37/3447
(Continued)

(56) References Cited

U.S. PATENT DOCUMENTS 3,625,848 A * 12/1971 Snaper .................. C23C 14/325
                                                        204/192.11
3,911,579 A    10/1975 Lane et al.
(Continued)

FOREIGN PATENT DOCUMENTS

CN    101035925 A    9/2007
CN    102230154 A    11/2011
(Continued)

OTHER PUBLICATIONS

Machine Translation JP 2002-129326 date May 2002.*
(Continued)

*Primary Examiner* — Rodney G McDonald

(57) ABSTRACT

A method for coating workpieces includes the following steps: charging a coating chamber with the workpieces to be coated; closing and evacuating the coating chamber to a predetermined process pressure, starting a coating source, which comprises a target as a material source, whereby particles are accelerated from the surface of the target toward substrates, characterized in that until the target has been conditioned a shield is provided between the target surface and the substrate, wherein meanwhile the substrates to be coated are at least partially subjected to a pretreatment.

8 Claims, 1 Drawing Sheet

(51) Int. Cl.
*C23C 14/02* (2006.01)
*C23C 14/32* (2006.01)
*H01J 37/34* (2006.01)

(52) U.S. Cl.
CPC .......... *C23C 14/022* (2013.01); *C23C 14/024* (2013.01); *C23C 14/325* (2013.01); *C23C 14/35* (2013.01); *H01J 37/3447* (2013.01)

(58) Field of Classification Search
USPC .......................... 204/192.12, 192.38, 298.11
See application file for complete search history.

(56) References Cited

U.S. PATENT DOCUMENTS

| | | | |
|---|---|---|---|
| 5,294,322 A | * | 3/1994 | Vetter ................... C23C 14/022 204/192.38 |
| 5,968,596 A | | 10/1999 | Ma et al. |
| 2002/0130033 A1 | | 9/2002 | Beitinger et al. |
| 2006/0060559 A1 | | 3/2006 | Fang et al. |
| 2008/0190758 A1 | | 8/2008 | Papachristos et al. |
| 2010/0180635 A1 | | 7/2010 | Fukumoto et al. |
| 2011/0220490 A1 | | 9/2011 | Wei et al. |

FOREIGN PATENT DOCUMENTS

| | | |
|---|---|---|
| DE | 10108344 A1 | 9/2001 |
| DE | 10312658 A1 | 9/2004 |
| DE | 602005001673 T2 | 4/2008 |
| DE | 102007058356 A1 | 12/2008 |
| EP | 0888463 B1 | 2/1997 |
| EP | 2050837 B1 | 12/2011 |
| EP | 2521159 A1 | 11/2012 |
| JP | 63-035774 * | 2/1988 |
| JP | H01225772 A | 9/1989 |
| JP | 2002129326 A | 5/2002 |
| JP | 2006-206959 * | 8/2006 |
| WO | 2013060415 A1 | 5/2013 |

OTHER PUBLICATIONS

Vetter et al. "Plasma diagnostics of arc-enhanced glow discharge", Surface and Coatings Technology, 76-77, (1995), pp. 322-327.*
P.J. Kelly, et al., "The Deposition of Aluminum Oxide Coatings by Reactive Unbalanced Magnetron Sputtering," Surface and Coatings Technology 86-87 (1996) pp. 28-32.
R. Garcia-Hernansanz, et al., "Hydrogenated Amorphous Silicon Deposited by High Pressure Sputtering for HIT Solar Cells," 2013 Spanish Conference on Electron Devices, Feb. 12-14, 2013, pp. 337-340.

* cited by examiner

TARGET PREPARATION

FIELD OF THE INVENTION

The present invention relates to a method for coating substrates.

BACKGROUND OF THE INVENTION

In particular, the present invention relates to a method for preparing a deposition from the gas phase under vacuum, wherein a target is used as the material source and particles from its surface fly to the substrate and are deposited on the latter. A reactive gas is frequently used, the atoms and/or molecules of which react with the particles so that the corresponding chemical compound is deposited on the substrate. This is then referred to as a reactive coating process.

Several such coating processes are well-known. As examples, magnetron sputtering and spark evaporation should be mentioned. The respective target surfaces are exposed to different ambient influences. For example, in many cases a chamber door must be opened for charging and discharging the coating chamber, so that the target surface is exposed to normal room atmosphere. Sometimes, when target poisoning has occurred due to the reactive gas, the target surface must also be exposed to special mechanical treatment, such as sandblasting. All these are circumstances that lead to the target surface differing from one coating pass to the next due to different environmental influences. If such a target surface were to be immediately used for coating, non-reproducible results would be the consequence. In particular, the beginning of the coating is not reproducible, which, among other things, has an essential influence on layer adhesion. Particularly in the field of wear protection, however, such incalculable differences in adhesion and in other layer properties are intolerable.

To counteract this, after closing and evacuating the coating chamber, coating is first started in such a way that by means of a shield the coating material is prevented from impinging and depositing on the substrate for a certain period of time. Such a process is called target conditioning.

Target conditioning can sometimes take half an hour or longer. FIG. 1 shows the optical signal of plasma burning in front of a target containing chromium during this conditioning. It can be seen quite clearly that the OES signal only stabilizes after about 30 minutes, which is a sign that conditioning is finished and no further essential changes will take place on the target surface. Consequently, the time required therefor leads to an extension of the coating period measured from the charging of the coating plant to discharging after coating.

It has already been mentioned that good layer adhesion is necessary for many applications. To achieve good layer adhesion, for example, the substrate has to have a clean surface. Cleaning the substrate to be coated must always be carried out outside of the coating chamber. However, some preparatory treatment steps of the substrate surface are only carried out within the chamber and under a vacuum after the coating chamber is closed. It is particularly advantageous to expose the substrate surface to an etching process shortly before coating, and particularly preferably by means of a plasma, i.e. a plasma etching process. Herein, it is quite common to remove as much as 1 µm from the surface. In this way, the last of the dirt particles are removed, and with certain substrate materials there is a near-surface concentration depletion, thus strongly increasing the adhesion of the layer material applied in the subsequent coating step. In some cases the surface of the substrate is activated by the pretreatment and, in particular, by the plasma etching, which in turn leads to better adhesion. It is a drawback, however, that this process step also takes considerable time so that after the coating chamber is closed and the evacuation started, it can sometimes take up to an hour before the actual coating can begin. The long waiting times have a direct effect on the overall duration of the method and thus the manufacturing cost of such layers.

It would thus be desirable to have a method that takes substantially less time without any deterioration of the product quality and, in particular, of the adhesion of the layer on the substrate.

The object of the present invention is based on this need.

SUMMARY OF THE INVENTION

The method according to the present invention for coating workpieces can comprise the following steps:
 charging a coating chamber with the workpieces to be coated;
 closing and evacuating the coating chamber to a predetermined process pressure;
 starting a coating source, which comprises a target as a material source, whereby particles are accelerated from the surface of the target toward substrates, characterized in that until the target is has been conditioned a shield is provided between the target surface and the substrate, wherein meanwhile the substrates to be coated are at least partially subjected to a pretreatment.

DETAILED DESCRIPTION OF THE PREFERRED EMBODIMENTS

Figure 1:
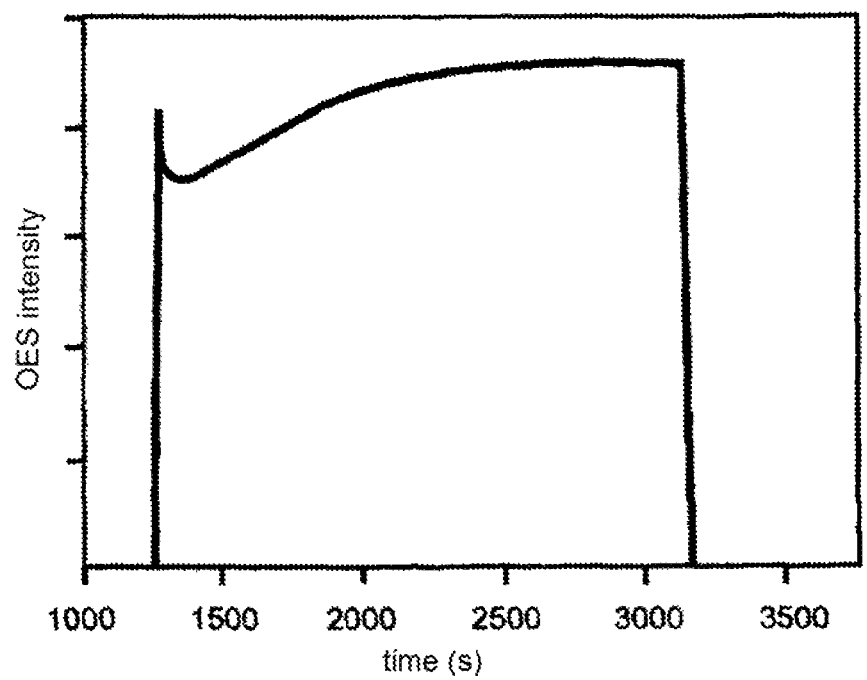
FIG. 1 shows the optical signal of plasma burning in front of a target containing chromium during target conditioning.
Figure 2:
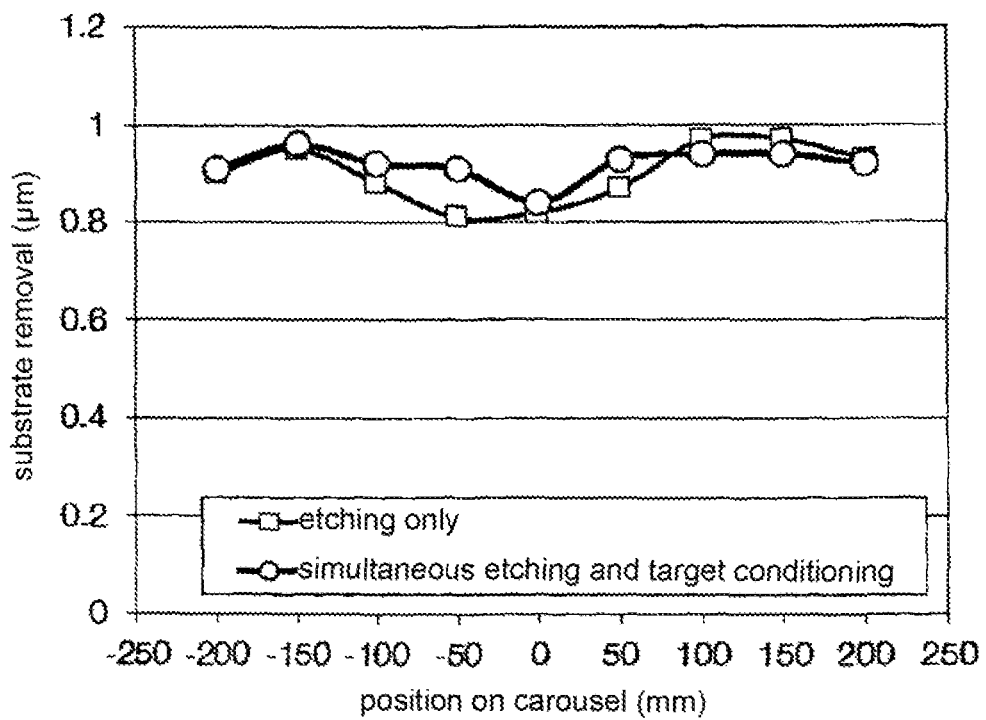
FIG. 2 shows the thickness of a layer removed in the course of substrate pretreatment as a function of the substrate position.

In their development work, the inventors determined much to their surprise that some of the method steps relating to the conditioning of the target and the pretreatment of the substrates in the coating chamber can be carried out in parallel. More precisely, after the coating chamber was evacuated to the necessary degree, the inventors were able to start target conditioning, and to begin pretreatment of the substrates at the same time. Although both processes usually need a plasma burning in the chamber, the two processes do not negatively affect each other. Even more surprising was that this does not only apply to one substrate position, but applies to the entire height over which substrates are usually arranged on a carousel within the coating chamber. FIG. 2 thus shows the thickness of the layer removed in the course of the substrate pretreatment as a function of the substrate position, in one case without conditioning the targets at the same time and in the other case with simultaneous target conditioning. The values measured were the substrate removal and the carousel. As can be derived from FIG. 2, the efficiency and homogeneity of plasma etching is only very marginally affected by whether or not the targets are conditioned at the same time.

The method according to the present invention for coating workpieces can therefore comprise the following steps:

charging a coating chamber with the workpieces to be coated;

closing and evacuating the coating chamber to a predetermined process pressure;

starting a coating source, which comprises a target as a material source, whereby particles are accelerated from the surface of the target toward substrates, characterized in that until the target is has been conditioned a shield is provided between the target surface and the substrate, wherein meanwhile the substrates to be coated are at least partially subjected to a pretreatment.

The pretreatment of the substrates can comprise an etching process.

According to a further embodiment, the pretreatment can comprise nitriding of the substrate surface as a method step. For example, a gas mixture of nitrogen, argon and hydrogen can be introduced into the chamber for this purpose.

Conditioning of the target can be ended, for example, when the optical signal emitted by the particles remains essentially unchanged. The optical signal can be measured by means of OES measuring.

The method is particularly suited to coating sources which are magnetron sputtering sources.

The coating chamber can comprise a plurality of magnetron sputtering sources which are sequentially, periodically connected in overlapping time intervals to a DC power generator haying a high power output, so that intermittently current densities of more than 0.2 A/cm$^2$ periodically occur on the target surfaces.

However, an electric arc evaporation source can also be used as the coating source in the method according to the present invention.

The invention claimed is:

1. A method for coating workpieces comprising the following steps:

charging a coating chamber with the workpieces to be coated;

closing and evacuating the coating chamber to a predetermined process pressure;

starting a coating source, which comprises a target as a material source, whereby particles are accelerated from the surface of the target toward substrates, and providing a shield between the target surface and the substrate until the target has been conditioned; and simultaneously subjecting the substrates to be coated to a pretreatment in which the workpieces are nitrided while the target is being conditioned.

2. The method according to, claim 1, wherein the pretreatment of the substrates comprises an etching process.

3. The method according to, claim 1, wherein the conditioning of the target is ended when an optical signal emitted by the particles remains essentially unchanged.

4. The method according to claim 3, wherein the optical signal is measured using OES measuring.

5. The method according to claim 1, wherein the coating source is a magnetron sputtering source.

6. The method according to claim 5, wherein the coating chamber comprises a plurality of coating sources which are sequentially, periodically connected in overlapping time intervals to a DC power generator having a high power output, so that intermittently current densities of more than 0.2 A/cm2 periodically occur on the target surfaces.

7. The method according to claim 1, wherein the coating source is an electric arc evaporation source.

8. The method according to 1, comprising, for nitriding, introducing a gas mixture into the chamber, wherein the gas mixture includes the elements nitrogen, argon and hydrogen.

* * * * *